United States Patent
Prechtl et al.

(10) Patent No.: US 9,847,394 B2
(45) Date of Patent: Dec. 19, 2017

(54) SEMICONDUCTOR DEVICE

(71) Applicant: Infineon Technologies Austria AG, Villach (AT)

(72) Inventors: Gerhard Prechtl, Rosegg (AT); Oliver Haeberlen, St. Magdalen (AT); Clemens Ostermaier, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/291,845

(22) Filed: Oct. 12, 2016

(65) Prior Publication Data

US 2017/0104076 A1    Apr. 13, 2017

(30) Foreign Application Priority Data

Oct. 13, 2015  (DE) .......................... 10 2015 117 394

(51) Int. Cl.
| | | |
|---|---|---|
| *H01L 29/66* | (2006.01) | |
| *H01L 29/40* | (2006.01) | |
| *H01L 29/20* | (2006.01) | |
| *H01L 29/778* | (2006.01) | |
| *H01L 29/423* | (2006.01) | |
| *H01L 29/861* | (2006.01) | |
| *H01L 29/06* | (2006.01) | |
| *H01L 29/10* | (2006.01) | |
| *H01L 29/205* | (2006.01) | |

(52) U.S. Cl.
CPC ........ *H01L 29/402* (2013.01); *H01L 29/2003* (2013.01); *H01L 29/42316* (2013.01); *H01L 29/778* (2013.01); *H01L 29/7786* (2013.01); *H01L 29/861* (2013.01); *H01L 29/0619* (2013.01); *H01L 29/1066* (2013.01); *H01L 29/205* (2013.01)

(58) Field of Classification Search
CPC . H01L 29/778; H01L 29/2003; H01L 29/402; H01L 29/42316; H01L 29/205; H01L 29/1066; H01L 29/0619; H01L 29/861; H01L 29/7786
See application file for complete search history.

(56) References Cited

U.S. PATENT DOCUMENTS

| | | | |
|---|---|---|---|
| 8,344,424 B2 * | 1/2013 | Suh | ...... H01L 29/1066 257/192 |
| 2006/0175633 A1 * | 8/2006 | Kinzer | ...... H01L 27/0605 257/192 |
| 2014/0203289 A1 * | 7/2014 | Liu | ...... H01L 29/432 257/76 |
| 2014/0264431 A1 | 9/2014 | Lal | |

(Continued)

FOREIGN PATENT DOCUMENTS

EP    2388819 A2    11/2011

*Primary Examiner* — Yosef Gebreyesus
(74) *Attorney, Agent, or Firm* — Murphy, Bilak & Homiller, PLLC

(57) ABSTRACT

In an embodiment, a semiconductor device includes a Group III-nitride-based High Electron Mobility Transistor (HEMT) configured as a bidirectional switch. The Group III nitride-based HEMT includes a first input/output electrode, a second input/output electrode, a gate structure arranged between the first input/output electrode and the second input/output electrode, and a field plate structure.

20 Claims, 12 Drawing Sheets

(56) References Cited

U.S. PATENT DOCUMENTS

2014/0374766 A1* 12/2014 Bahl .................. H01L 27/0629
                                                                257/76
2015/0236108 A1*  8/2015 Kim .................. H01L 29/42312
                                                               257/194

* cited by examiner

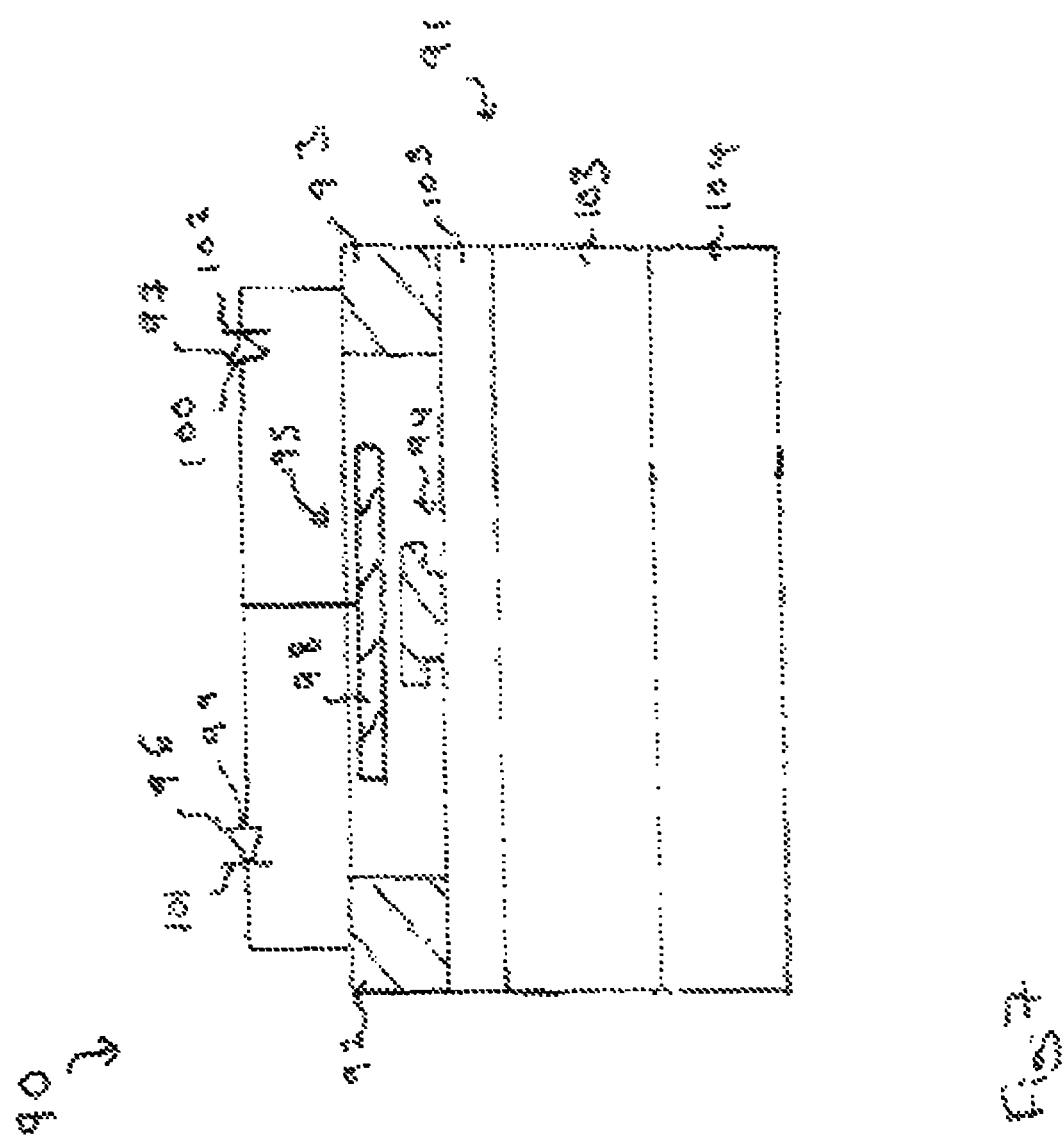

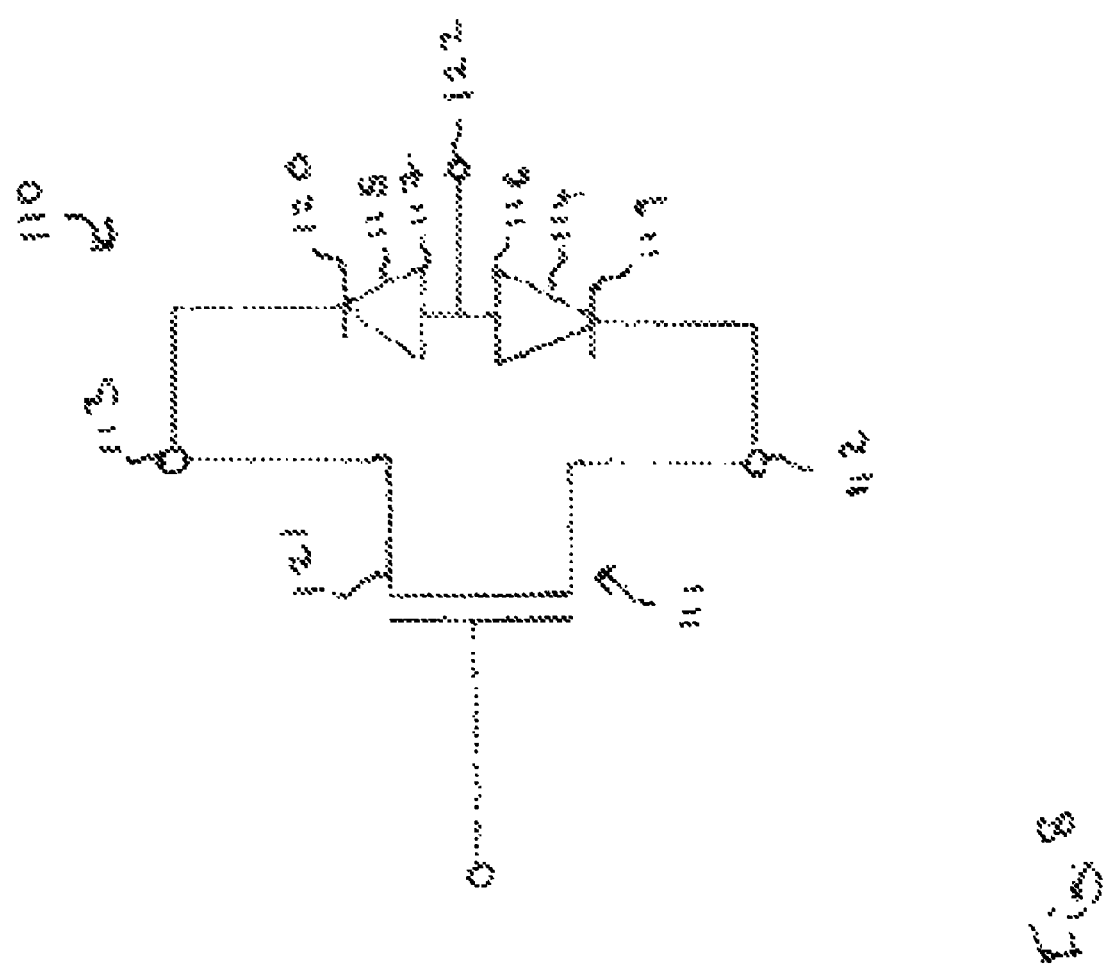

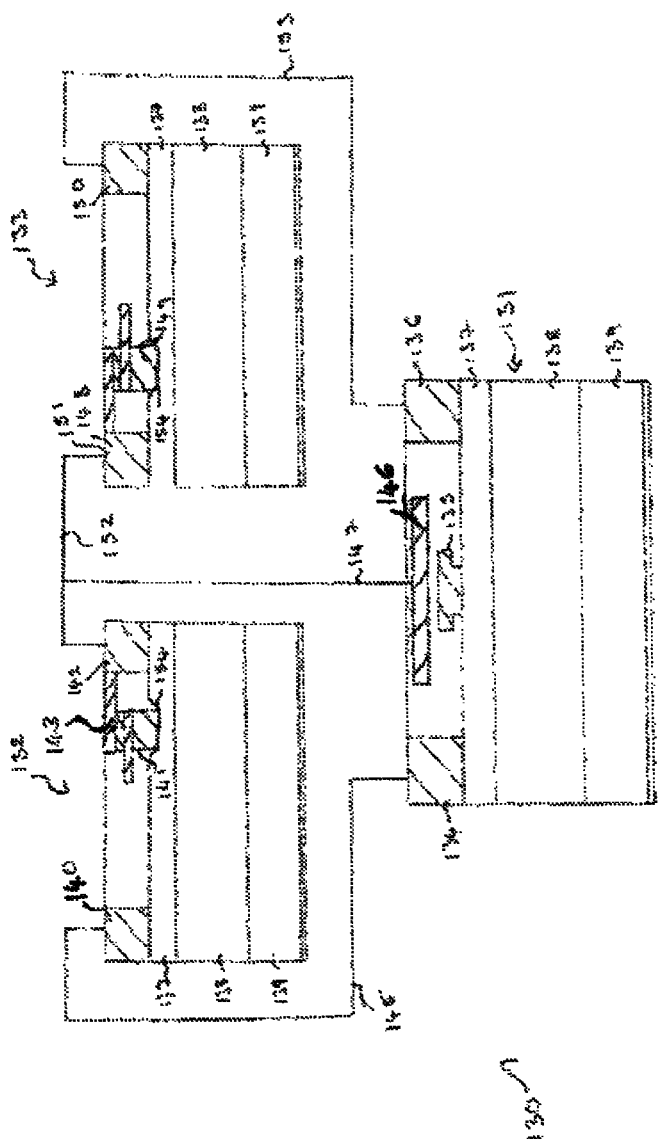

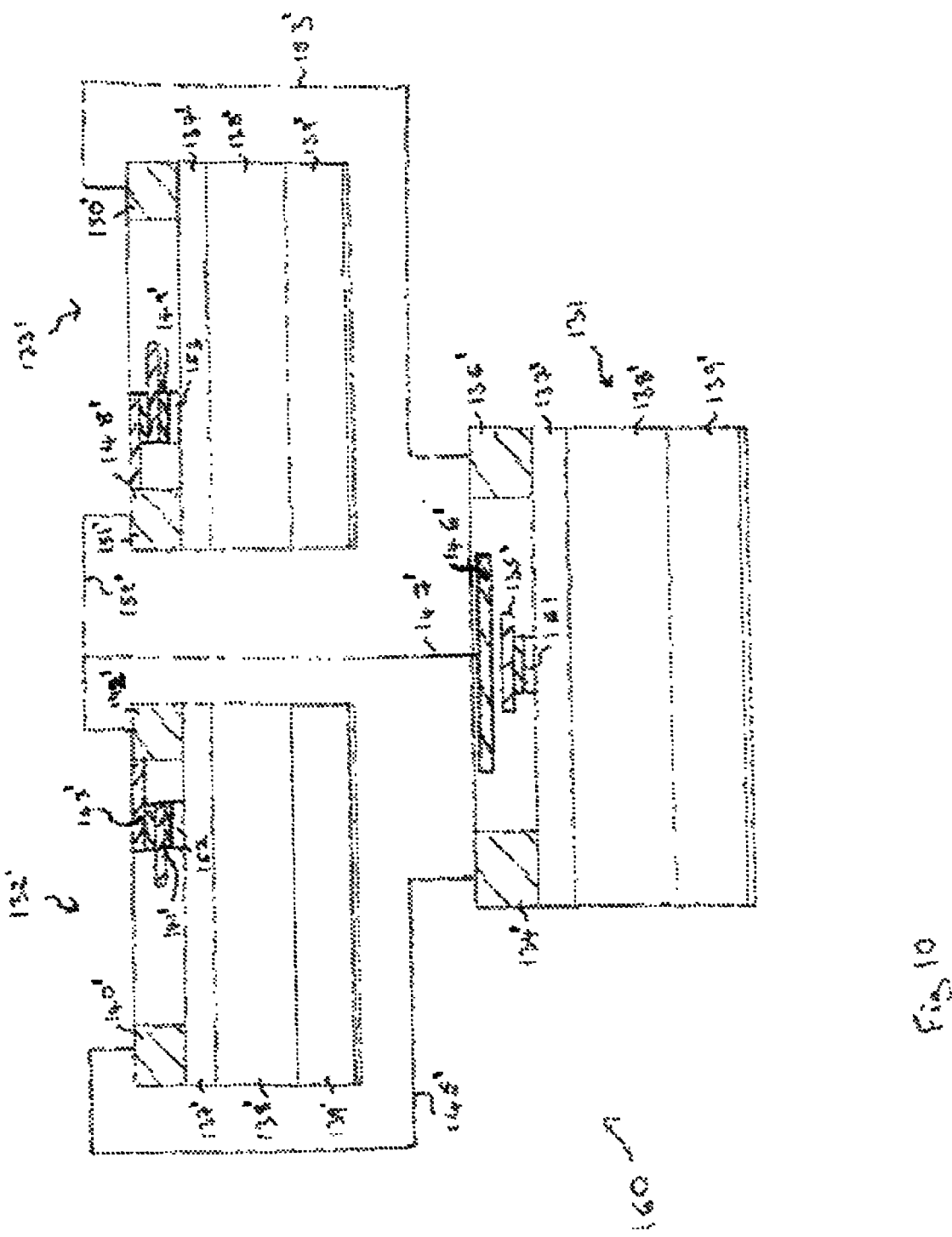

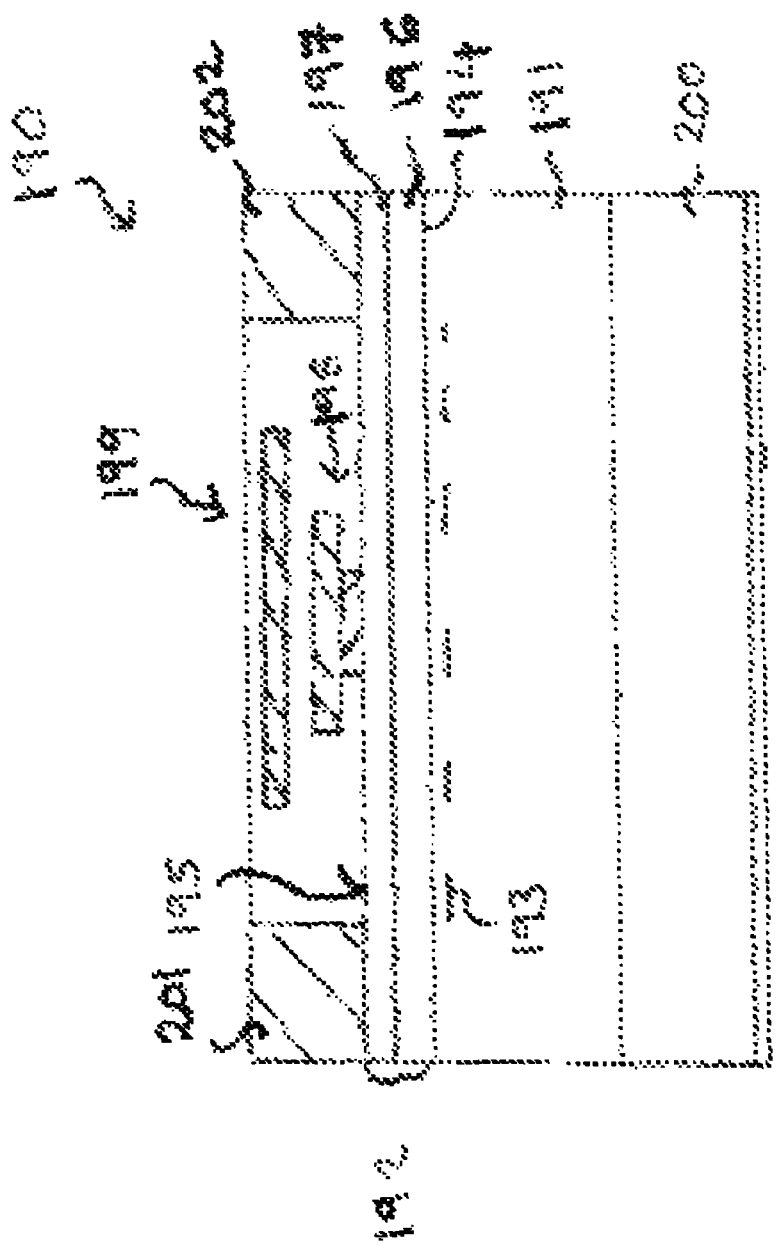

SEMICONDUCTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

For some applications, such as power factor correction (PFC), a bidirectional switch device which can block voltage in two directions may be useful.

SUMMARY

In an embodiment, a semiconductor device includes a Group III-nitride-based High Electron Mobility Transistor configured as a bidirectional switch. The Group III nitride-based High Electron Mobility Transistor includes a first input/output electrode, a second input/output electrode, a gate structure arranged between the first input/output electrode and the second input/output electrode and a field plate structure.

In an embodiment, a semiconductor device includes a Group III-nitride-based High Electron Mobility Transistor configured as a bidirectional switch. The Group III-nitride-based High Electron Mobility Transistor includes a first input/output electrode, a second input/output electrode, a gate structure arranged between the first input/output electrode and the second input/output electrode, a field plate structure, a first diode and a second diode. The first diode and the second diode are coupled antiserially between the first input/output electrode and the second input/output electrode.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 7 illustrates a schematic view of a semiconductor device including a bidirectional switch, two antiserially coupled diodes and a field plate structure.

FIG. 8 illustrates a circuit diagram of the semiconductor device according to FIG. 7.

FIG. 9 illustrates a schematic view of a semiconductor device including a bidirectional switch, two antiserially coupled diodes and a field plate structure.

FIG. 10 illustrates a schematic view of a semiconductor device including a bidirectional switch, two antiserially coupled diodes and a field plate structure.

FIG. 11 illustrates a schematic view of an enhancement mode semiconductor device including a bidirectional switch.

FIG. 12 illustrates a schematic view of a Group III nitride-based device including a bidirectional switch.

DETAILED DESCRIPTION

Figure 1:
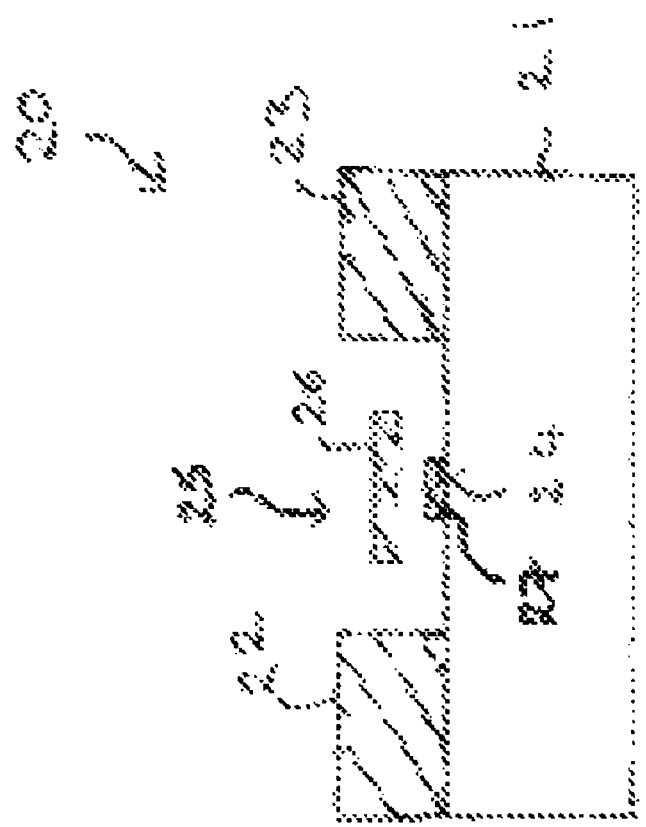
FIG. 1 illustrates a schematic view of a semiconductor device including a bidirectional switch and a field plate structure.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a high-voltage depletion-mode transistor, has a negative threshold voltage which means that it can conduct current at zero gate voltage. These devices are normally on. And enhancement-mode device, such as a low-voltage enhancement-mode transistor, has a positive threshold voltage which means that it cannot conduct current at zero gate voltage and is normally off.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where 0<x<1.

FIG. 1 illustrates a schematic view of a semiconductor device 20 including a Group III nitride-based High Electron Mobility Transistor (HEMT) 21 configured as a bidirectional switch. The Group III nitride-based HEMT 21 includes a first input/output electrode 22, a second input/output electrode 23, a gate structure 24 arranged between the first input/output electrode 22 and the second input/output electrode 23 and a field plate structure 25.

When the first input/output electrode 22 acts as the input, for example the source, the second input/output electrode 23 acts as the output, for example, the drain, of the bidirectional switch. Conversely, when the second input/output electrode 23 acts as the input, the first input/output electrode 22 acts as the output of the bidirectional switch.

In some embodiments, the field plate structure 25 is arranged substantially symmetrically with respect to the first input/output electrode 22 and the second input/output electrode 23. The field plate structure 25 may be arranged such that it is functionally symmetrically arranged between the first input/output electrode 22 and the second input/output electrode 23. In some embodiments, the field plate structure 25 is physically spaced at substantially equal distances from the first input/output electrode 22 and from the second input/output electrode 23.

In some embodiments, a bidirectional switch is provided which has a different voltage blocking capability in the two opposing directions, for example 600V in a first direction and 100V in the opposing direction, or 66V in a first direction and 12V in the opposing direction.

In embodiments, in which the Group III nitride-based HEMT 21 includes a single gate, the single gate may be arranged asymmetrically, i.e. at different distances, from a first input/output contact pad and a second input/output contact pad of the HEMT to provide a different blocking capability in the two opposing directions.

In some embodiments, the field plate structure 25 is arranged asymmetrically with respect to the first input/output electrode 22 and the second input/output electrode 23. The field plate structure 25 may be arranged such that it is functionally asymmetrically arranged between the first input/output electrode 22 and the second input/output electrode 23. In some embodiments, the field plate structure 25 is physically spaced at different distances from the first input/output electrode 22 and from the second input/output electrode 23. These asymmetric arrangements may be used for embodiments in which the bidirectional switch is configured to block different voltages in the two directions, for example a higher voltage in a first direction than in a second direction which opposes the first direction.

The field plate structure 25 may be coupled to gate potential, a floating potential, or source potential. In the embodiment illustrated in FIG. 1, the gate structure 24 includes a single gate 27 and the field plate structure 25 is provided by a field plate 26. In some embodiments, the field plate structure is coupled to the gate structure 24. In some embodiments, the field plate structure is coupled to the first input/output 22 and to the second input/output 23.

In some embodiments, the field plate structure 25 includes a vertical portion and horizontal portion extending from the vertical portion. The vertical portion may be arranged on and coupled to the gate structure. The field plate structure can be considered to have a T-shape and may be arranged directly on the gate metal. The horizontal portion may extend beyond the lateral extent of the underlying gate structure. The horizontal portion may extend substantially symmetrically between the first input/output electrode and the second input/output electrode. For example, the distance between a first distal end of the horizontal portion and the first input/out electrode and the distance between a second distal end of the horizontal portion, which opposes the first distal end, and the second input/output electrode may be substantially the same.

In some embodiments, the gate may also include a T-shaped gate metal. In embodiments, in which both the gate and the field plate structure has a T-shape, a stacked T on T arrangement may be provided in which the field plate structure is electrically coupled to the gate. In these embodiments, the horizontal portion of the T-shaped field plate structure may extend beyond the lateral extent of the bar or horizontal portion of the T-shaped gate metal.

In some embodiments, the gate structure 24 includes two independently controllable gates. This structure may also be denoted as a split gate structure or dual gate. The two independently controllable gates may be spaced apart from one another and arranged between the first input/output electrode 22 and the second input/output electrode 23. In some embodiments, in which the gate structure 24 includes two independently controllable gates, the field plate structure may include a vertical portion arranged between the two gates and horizontal portion extending from the vertical portion. The horizontal portion may have a lateral extent such that it extends over the two gates. The field plate structure may be substantially T-shaped.

In some embodiments in which the gate structure 24 includes two independently controllable gates, the field plate structure 25 may include a first portion coupled to the first input/output electrode 22 and a second portion coupled to the second input/output electrode. The first portion may extend from the first input/output electrode 22 and may extend over a first gate arranged adjacent the first input/output electrode. The second portion may extend from the second input/output electrode and may extend over a second gate arranged adjacent the second input/output electrode 23. In these embodiments, the first portion and the second portion of the field plate structure are spaced apart from one another.

The bidirectional switch is provided by a single Group III nitride-based HEMT 21. The semiconductor device may be a high-voltage device or a low-voltage device. The Group III nitride-based HEMT 21 may be a depletion mode device or an enhancement mode device.

At least one p-doped Group III nitride layer may be arranged under the gate to provide an enhancement mode device. In some embodiments, the p-doped Group III-nitride layer may include at least one of a p-doped GaN layer and a p-doped aluminium gallium nitride layer, $Al_zGa_{(1-z)}N$, wherein $0<z<1$, arranged under the gate to provide an enhancement mode device. In some embodiments a single p-doped GaN layer or a single p-doped aluminium gallium nitride layer is arranged under the gate. In some embodiments, a stack including a p-doped aluminium gallium nitride layer, a p-doped gallium nitride layer arranged on the p-doped aluminium gallium nitride layer and a gate arranged on the p-doped gallium nitride layer is provided to form an enhancement mode device.

In some embodiments, a gate recess is provided in which the gate is arranged to provide an enhancement mode device.

The Group III nitride-based high electron mobility transistor 21 may include a channel layer including gallium nitride (GaN) and a barrier layer arranged on the channel layer. The barrier layer may include aluminium gallium nitride ($Al_xGa_{(1-x)}N$, wherein $0<x<1$).

The barrier layer may include a spatially varying aluminium content. For example, the aluminium content may vary over the thickness of the barrier layer. In some embodiments, the barrier layer has a graded composition such that the aluminium content gradually increases and the gallium content gradually decreases in a direction from the channel layer to the gate. In some embodiments, the barrier layer includes two or more sublayers, each including aluminium gallium nitride having a different aluminium content and, consequently, a different gallium content.

A semiconductor device is also provided which includes a Group III nitride-based High Electron Mobility Transistor (HEMT) configured as a bidirectional switch. The Group III nitride-based High Electron Mobility Transistor includes a first input/output electrode, a second input/output electrode, a gate structure arranged between the first input/output electrode and the second input/output electrode, a field plate structure, a first diode and a second diode. The first diode and the second diode are coupled anti-serially between the first input/output electrode and the second input/output electrode.

As used herein, first diode and second diode are used to denote a first diode function and a second diode function. The first diode and the second diode may each be formed by a single discrete component or by two or more discrete diodes coupled in series. In some embodiments, the first diode and the second diode may be integrated into the semiconductor body providing the HEMT. For example, each of the first diode and the second diode may be formed from one or more MOS-gated transistor cells coupled in series.

The gate structure may include a single gate which is arranged between the first input/output electrode and the second input/output electrode. In embodiments in which the gate structure includes a single gate, the anode of the first diode and the anode of the second diode may be coupled to a floating field plate which is arranged over the single gate. In this embodiment, the field plate structure is electrically coupled via the diodes to the first input/output electrode and the second input/output electrode.

In embodiments in which the anode of the first diode and the anode of the second diode are coupled to a floating field plate, the cathode of the first diode may be coupled to the first input/output electrode and the cathode of the second diode may be coupled to the second input/output electrode.

In embodiments, in which the semiconductor device includes a single gate, the single gate may be arranged symmetrically between the first input output electrode and the second input output electrode.

The Group III nitride-based High Electron Mobility Transistor may include a channel layer including gallium nitride (GaN) and a barrier layer arranged on the channel layer. The barrier layer may include aluminium gallium nitride ($Al_xGa_{(1-x)}N$, wherein $0<x<1$).

The barrier layer may include a spatially varying aluminium content. For example, the aluminium content may vary over the thickness of the barrier layer. In some embodiments, the barrier layer has a graded composition such that the aluminium content gradually increases and the gallium content gradually decreases in a direction from the channel layer to the gate. In some embodiments, the barrier layer includes two or more sublayers, each including aluminium gallium nitride having different aluminium content and, consequently, a different gallium content.

As discussed above, the first diode and the second diode may each include a discrete component. In some embodiments, the first diode and the second diode are integrated into the HEMT. The first diode and the second diode may be a pn-diode.

At least one of a p-doped GaN layer and a p-doped aluminium gallium nitride layer ($Al_zGa_{(1-z)}N$, wherein $0<z<1$) may be arranged under the gate to provide an enhancement mode device. In some embodiments a single p-doped GaN layer or a single p-doped aluminium gallium nitride layer is arranged under the gate. In some embodiments, two or more p-doped Group III nitride layers may be arranged under the gate. In an embodiment, a stack including a p-doped aluminium gallium nitride layer, a p-doped gallium nitride layer arranged on the p-doped aluminium gallium nitride layer and a gate arranged on the p-doped gallium nitride layer is provided to form an enhancement mode device.

At least one of the first diode and the second diode may be formed from one or more transistor cells of the HEMT which have a MOS-gated structure. In embodiments, in which the HEMT is an enhancement mode device and includes a p-doped GaN layer and/or a p-doped aluminium gallium nitride layer under the gate, at least one of the first and second diode may be formed using a pn diode. In some embodiments, one diode may be a pn diode and the other diode may include one or more transistor cells having a MOS-gated structure.

The first diode may include a transistor structure including a first current electrode, a gate electrode and a second current electrode. The gate electrode is electrically coupled to the first current electrode to form the MOS-gated structure and the second current electrode may be electrically coupled to one of the input/output electrodes of the HEMT. The transistor structure providing the diode includes an enhancement mode transistor structure. This may be provided by a p-doped Group III-nitride layer arranged under the gate or a gate recess structure, for example. The p-doped Group III-nitride layer may include at least one of a p-doped GaN layer and a p-doped aluminium gallium nitride layer, $Al_zGa_{(1-z)}N$, for example.

In embodiments in which the HEMT is a depletion mode device, the transistor structure of the transistor cells forming the diodes differs from the transistor structure of the transistor cells forming the HEMT. For example, the transistor cells forming the diodes may include a p-doped Group III-nitride layer arranged between the gate and the barrier layer whereas in the transistor cells forming the bidirectional switch, the gate may be arranged directly on the barrier layer. In another example, the transistor cells forming the diodes may include a recessed gate, such that the thickness of the barrier layer under the gate is reduced, whereas in the transistor cells forming the bidirectional switch, the barrier layer has a substantially uniform thickness adjacent and under the gate.

Figure 2:
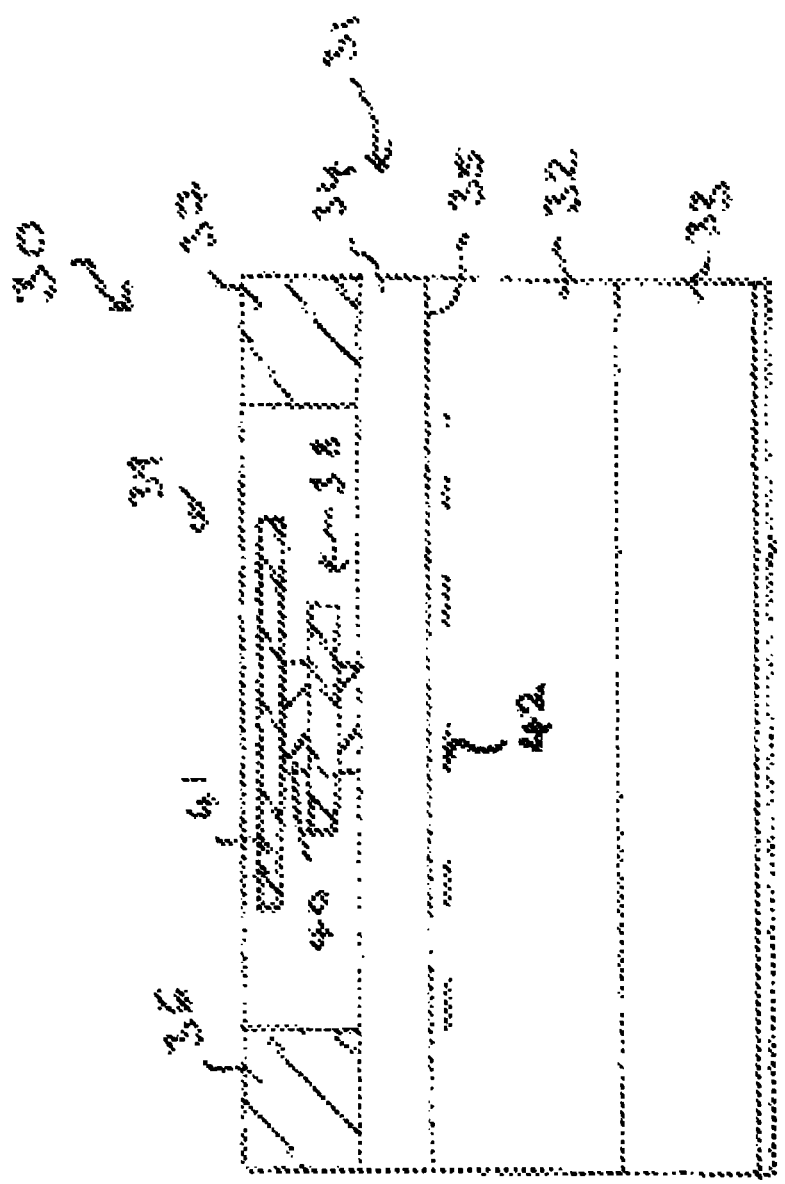
FIG. 2 illustrates a schematic view of a semiconductor device including a bidirectional switch and a field plate structure.

FIG. 2 illustrates a semiconductor device 30 including a Group III nitride-based HEMT 31 configured as a bidirectional switch. The Group III nitride-based HEMT 31 includes a channel layer 32 arranged on a substrate 33 and a barrier layer 34 arranged on the channel layer 32. The channel layer 32 includes gallium nitride (GaN) and the barrier layer 34 includes aluminium gallium nitride ($Al_xGa_{(1-x)}N$, wherein 0<x<1). A two dimensional electron gas (2DEG), indicated schematically in FIG. 2 by dashed line 42, may be formed by induced and spontaneous polarisation at the interface 35 between the channel layer 32 and the barrier layer 34. The substrate 33 may include silicon, silicon carbide or sapphire. One or more buffer layers or transition layers may be arranged between the substrate 33 and the channel layer 32.

The Group III nitride-based HEMT 31 is a lateral device including a first input/output electrode 36, a second input/output electrode 37 and a gate 38 arranged on the barrier layer 34. The gate 38 includes a T shape and is arranged substantially symmetrically between the first input/output electrode 36 and the second input/output electrode 37. This arrangement may be used to achieve a substantially symmetrical voltage blocking capability in both directions.

The semiconductor device 30 further includes a field plate structure 39 which is coupled to gate potential. The field plate structure 39 includes a T-shape having a vertical portion 40 and horizontal portion 41 extending laterally outwardly from the vertical portion 40. The field plate structure 39 can be considered to have a T-shape. The field plate structure 39 is arranged on and electrically coupled to the T-shaped gate 38. The lateral extent of the horizontal portion 41 of the field plate structure 39 is larger than the lateral extension extent of the T-shaped gate 38.

The field plate structure 39 may be used to increase the reliability of the bidirectional lateral switch provided by the HEMT 31.

Figure 3:
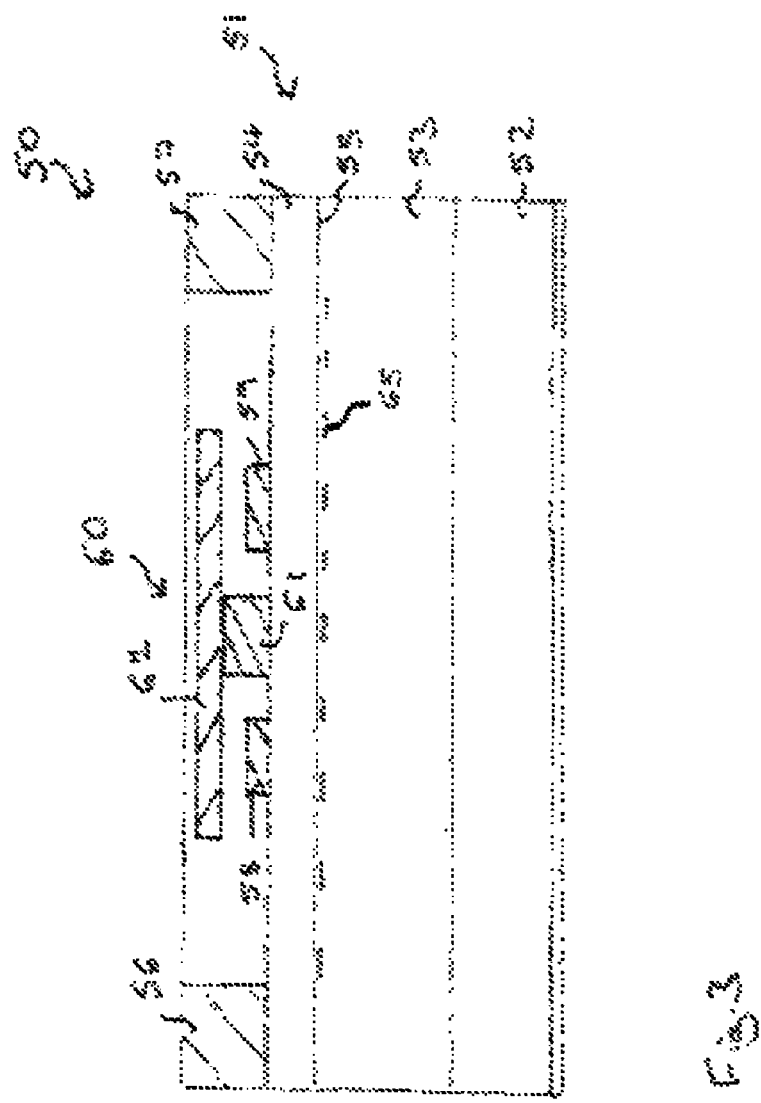
FIG. 3 illustrates a schematic view of a semiconductor device including a bidirectional switch and a field plate structure.

FIG. 3 illustrates a semiconductor device 50 including a Group III nitride-based HEMT 51 configured as a bidirectional switch. The Group III nitride-based HEMT 51 includes a substrate 52, a channel layer 53 arranged on the substrate 52 and a barrier layer 54 arranged on the channel layer 53. The channel layer 53 includes gallium nitride (GaN) and the barrier layer 54 includes aluminium gallium nitride ($Al_xGa_{(1-x)}N$, wherein 0<x<1) such that a two-dimensional electron gas (2DEG), indicated schematically in FIG. 3 by dashed line 65, may be formed at the interface 55 between the channel layer 53 and the barrier layer 54. The first input/output electrode 56 and the second input/output electrode 57 are arranged on the barrier layer 54 and are spaced apart from one another. In this embodiment, the Group III nitride-based HEMT 51 includes two independently controllable gates 58, 59 spaced apart from one another and arranged on the barrier layer 54 between the first input/output electrode 56 and the second input/output electrode 57.

The Group III nitride-based HEMT 51 includes a field plate structure 60 which is coupled to source potential. The field plate structure 60 includes a vertical portion 61 and horizontal portion 62 extending from the vertical portion 61. The vertical portion 61 is arranged between the two gates 58, 59 and horizontal portion 62 extends over and is spaced apart from the gates 58, 59. The lateral extent of the horizontal portion 62 is such that it extends in directions towards the first input/output electrode 56 and beyond the outermost facing edge of the gate 58 and in the opposing direction towards the second input/output electrode 57 and beyond the outermost face edge of the gate 59. The gate to source spacing and the gate to drain spacing is selected such that the blocking voltage requirements are met.

By using a proper gate switching sequence, the field plate structure 60 arranged in the centre between the first input/output electrode 56 and the second input/output electrode 57 is coupled to source or near source potential. This may be used to allow a reduction of the electric fields at the gate edge towards the high voltage terminal together with a low gate-drain capacitance value.

Figure 4:
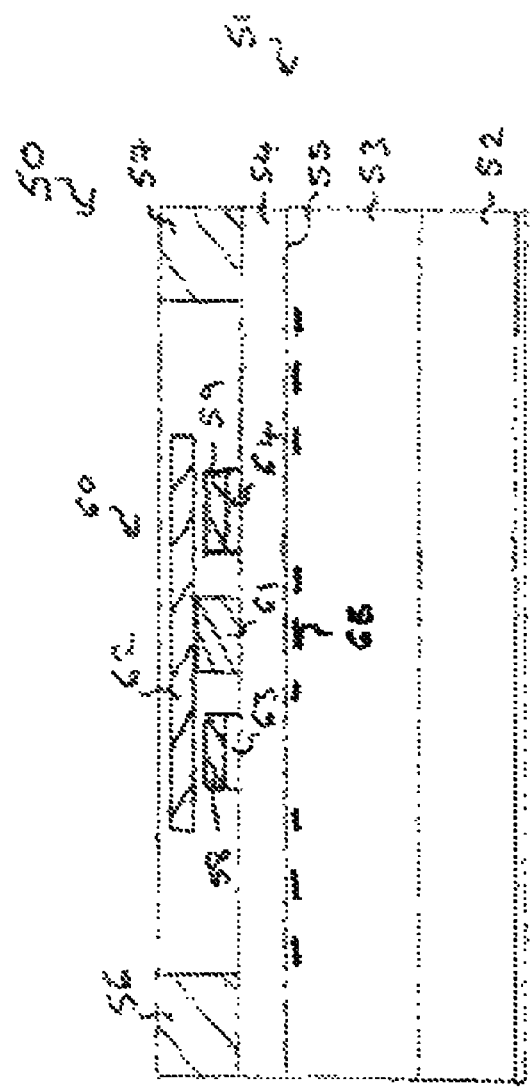
FIG. 4 illustrates a schematic view of a semiconductor device including a bidirectional switch and a field plate structure.

The Group III nitride-based HEMT 51 may be a depletion mode device. In some embodiments, such as that illustrated in FIG. 4, the Group III nitride-based HEMT 51 is an enhancement mode device. In the embodiment illustrated in FIG. 4, a p-doped gallium nitride layer 63 is arranged between the first gate 58 and the barrier layer 54 and a p-doped gallium nitride layer 64 is between the second gate 59 and the barrier layer 54 in order to provide an enhancement mode transistor device which is normally off. The two-dimensional electron gas (2DEG) formed at the interface 55 between the channel layer 53 and the barrier layer 54 is indicated schematically in FIG. 4 by dashed line 66. The lateral extent of the p-doped gallium nitride layers 63, 64 corresponds to the lateral extent of the base of the respective gate 58, 59. The vertical portion 61 of the field plate structure 59 is arranged between the p-doped GaN layers 63, 64 and their respective gate 58, 59 and is in contact with the barrier layer 54.

In some embodiments, a p-doped AlGaN layer may be used in place of the p-doped gallium nitride (GaN) layers 63, 64. In some embodiments, two p-doped Group III nitride based sublayers are provided between the gates 58, 59 and the barrier layer 54. For example, p-doped aluminium gallium nitride sublayer may be arranged on the barrier layer 54, a p-doped gallium nitride sub layer may be arranged on the p-doped aluminium gallium nitride sub layer and the gate 58, 59 arranged on the p-doped gallium nitride sublayer.

Figure 5:
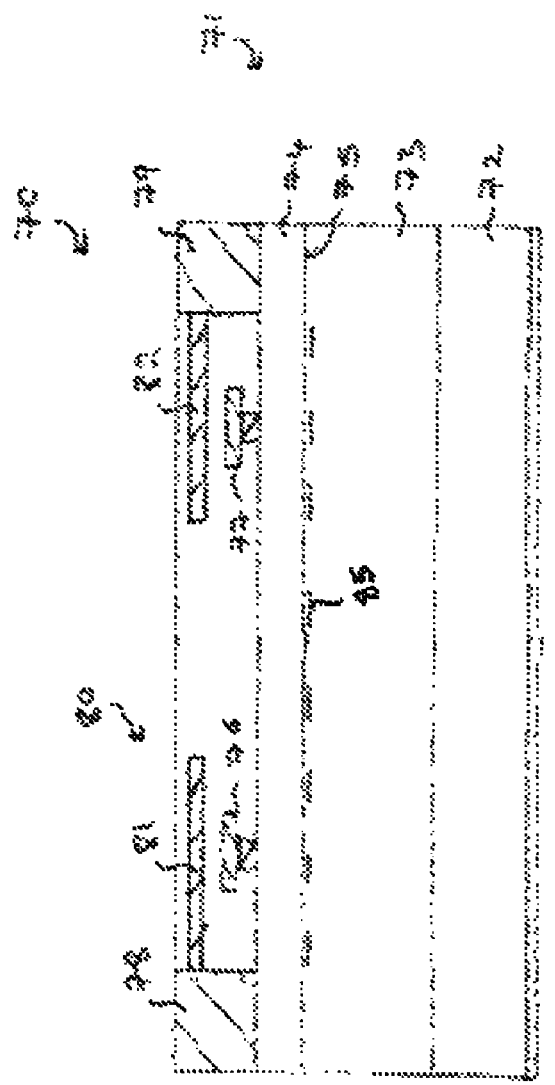
FIG. 5 illustrates a schematic view of a semiconductor device including a bidirectional switch and a field plate structure.

FIG. 5 illustrates a semiconductor device 70 including a Group III nitride-based HEMT 71 configured as a bidirectional switch. The Group III nitride-based HEMT 71 includes a substrate 72, a channel layer 73 including gallium nitride arranged on the substrate 72 and a barrier layer 74 including aluminium gallium nitride arranged on the channel layer 73. A two-dimensional electron gas (2DEG) can be formed at the interface 75 between the channel layer 73 and the barrier layer 74, as is indicated schematically in FIG. 5 by dashed line 85. The Group III nitride-based HEMT 71 includes two independently operable gates 76, 77 which are arranged on the barrier layer 74 and spaced apart from one another. Each of the gates 76, 77 includes a T-shape. The Group III nitride-based HEMT 71 also includes a first input/output electrode 78 and second input/output electrode 79 arranged on the barrier layer 74. The gates 76, 77 are arranged between the first input/output electrode 78 and second input/output electrode 79.

The Group III nitride-based HEMT 71 also includes a field plate structure 80 which, in this embodiment, includes two separate portions. A first portion 81 extends from the first input/output electrode 78 over the first gate 76. The first portion 81 is substantially horizontal and spaced apart and above first gate 76. The field plate structure 80 also includes a second portion 82 which extends substantially horizontally from the second input/output electrode 79 over the second gate 77. The second portion 82 may be substantially coplanar with the first portion 81 and is also spaced apart and above the second gate 77. The first portion 81 of the field plate structure 80 is electrically coupled to the first input/output electrode 78 and the second portion 82 of the field plate structure 80 is electrically coupled to the second input/output electrode 79. The Group III nitride-based HEMT 71 may be considered to have a symmetrical structure about a plane arranged equidistant between the first input output electrode 78 and the second input/output electrode 79.

When the first input/output electrode 78 acts as the input of the bidirectional switch, for example the source, the first portion of the field plate structure 80 is coupled to source potential. When the first input/output electrode 78 acts as the output of the bidirectional switch, for example the drain, the first portion of the field plate structure 80 is coupled to drain potential.

The gate-drain capacitance of the HEMT 71 may be decoupled from the gate, since one of the field plates 81, 82 is always coupled to source or near source potential. This enables switching performance to be improved by reducing the electric fields at the gate edges.

Figure 6:
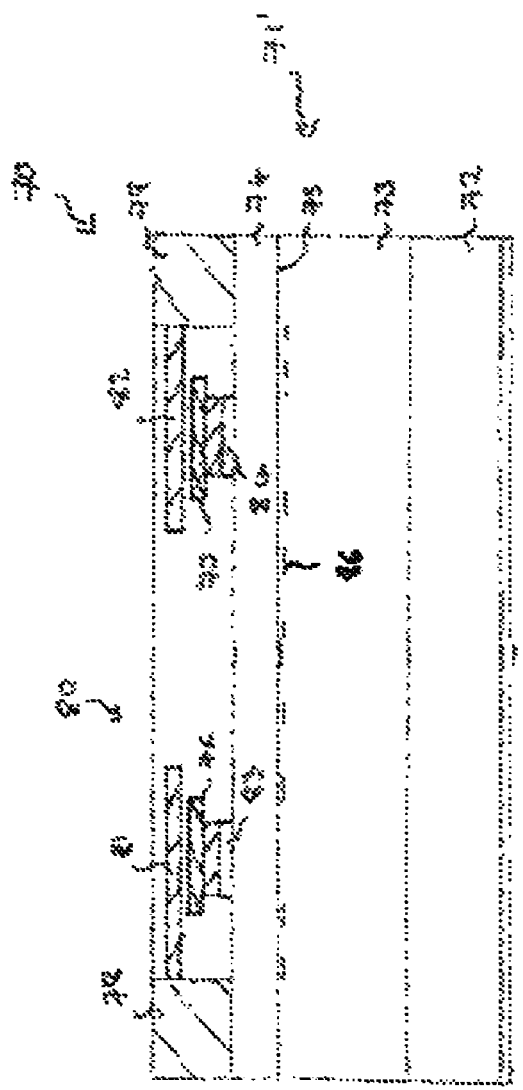
FIG. 6 illustrates a schematic view of a semiconductor device including a bidirectional switch and a field plate structure.
Figure 13:
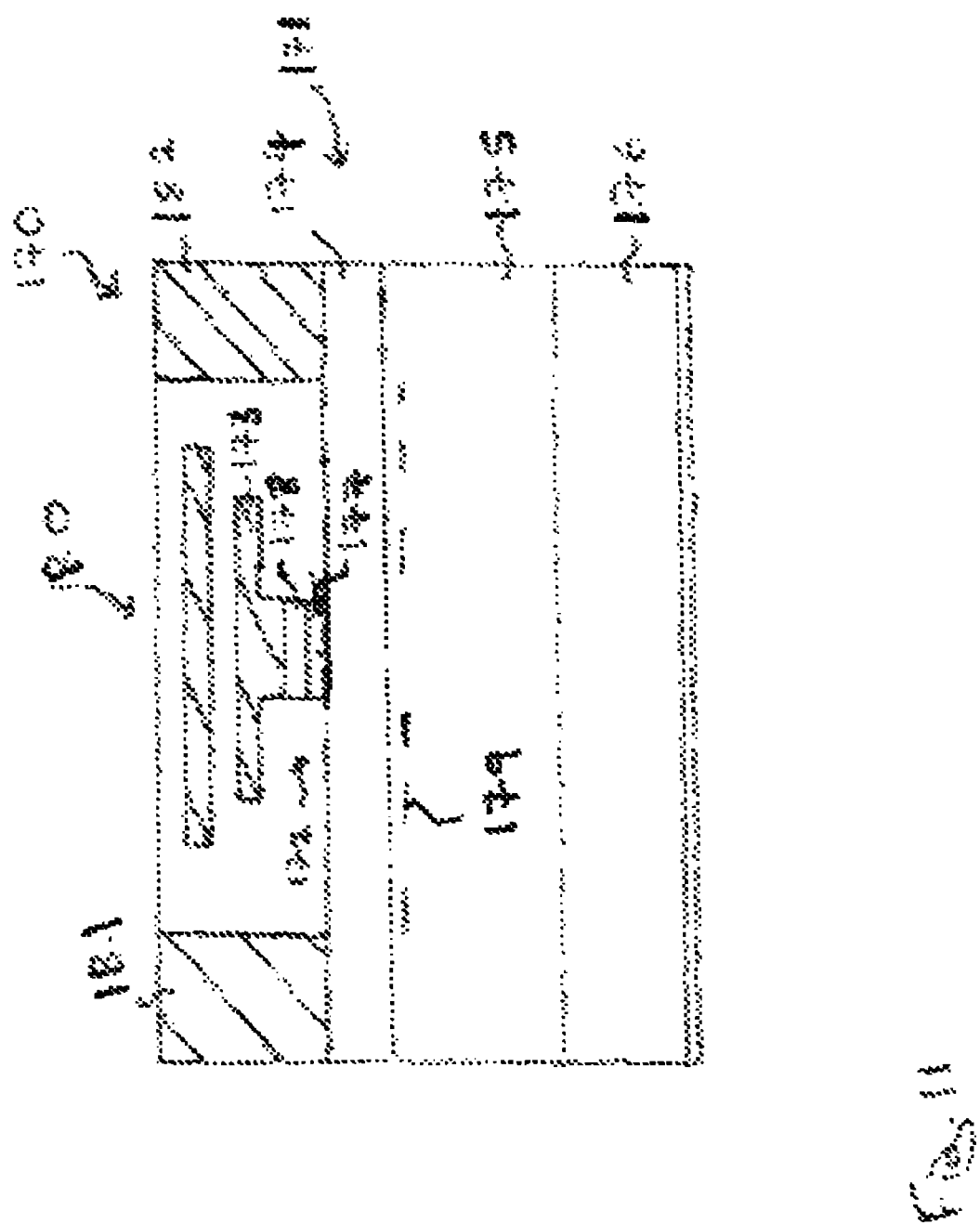

The Group III nitride-based HEMT 71 is a depletion mode device in the embodiment illustrated in FIG. 5. However, the field plate structure 80 may also be used for the enhancement mode device as is illustrated in FIG. 6. The enhancement mode Group III nitride-based HEMT 71' illustrated in FIG. 6 includes the field plate structure 80 including a first portion 81 and a second portion 82 and two gates 76, 77. The Group III nitride-based HEMT 71' differs in that a p-doped Group III nitride layer 84, 84, such as a p-doped gallium nitride layer or a p-doped AlGaN layer, is arranged between each of the gates 76, 77 and the barrier layer 74. The lateral extent of the p-doped Group III nitride layer 83, 84 is substantially the same as the lateral extent of the vertical portion of the T-shaped gate 76, 77. The two-dimensional electron gas (2DEG) formed at the interface 75 between the channel layer 72 and the barrier layer 73 is indicated schematically by dashed line 86.

FIG. 7 illustrates a semiconductor device 90 including a Group III nitride-based HEMT 91 configured as a bidirectional switch. The HEMT 91 includes a first input/output electrode 92, a second input/output electrode 93, a gate structure 94, a field plate structure 95, a first diode 96 and a second diode 97. The first diode 96 and the second diode 97 are coupled anti-serially between the first input/output electrode 92 and the second input/output electrode 93 and are electrically coupled to the field plate structure 95.

The field plate structure 95 includes an electrically conductive field plate 98 arranged above the gate structure 94 and is electrically coupled to the first input/output electrode 92 and the second input/output electrode 93 via the first diode 96 and second diode 97. In particular, the anode 99 of the first diode 96 and the anode 100 of the second diode 97 are electrically coupled to the field plate 98. The cathode 101 of the first diode 96 is electrically coupled to the first input/output electrode 92 and the cathode 102 of the second diode 97 is electrically coupled to the second input/output electrode 93.

In a bidirectional switch, the source potential is not fixed to a dedicated terminal as the source and the drain are interchangeable. The diodes 96, 97 are configured to withstand the maximum blocking voltage rating of the HEMT 91. Due to the provision of the two anti-serially coupled diodes 96, 97, a single HEMT device 91 may provide a bidirectional switch in which the input is coupled to the field plate structure 95 in both switching directions. An additional voltage corresponding to the forward voltage drop of the diode is included in the potential of the field plate structure 95. Consequently, the potential of the field plate structure 95 is slightly different from the pure source potential and is termed herein "near source" potential. The field plate structure 95 can be considered to be a self-adapting field plate which has a near source potential which is independent of the drain potential. Consequently, the gate drain capacitance may be decoupled and the electric field at the gate edges reduced. This may lead to an improvement in the lifetime requirements of the device.

The Group III nitride-based HEMT 91 includes a channel layer 103 arranged on a substrate 104 and a barrier layer 105 arranged on the channel layer 103. The channel layer 103 may include gallium nitride (GaN) and the barrier layer 105 may include aluminium gallium nitride ($Al_xGa_{(1-x)}N$, wherein 0<x<1). In this embodiment, the gate structure 94 includes a T-shaped metal. The lateral extent of the field plate 98 is greater than the lateral extent of the T-shaped gate structure 94.

In some embodiments, the diodes 96, 97 are provided by discrete components. In some embodiments, the diodes 96, 97 are integrated into the HEMT 91. In some embodiments, the diodes 96, 96 are provided by one or more transistor cells of the HEMT which are modified to have a MOS-gated structure.

FIG. 8 illustrates a schematic circuit diagram of the arrangement provided by the semiconductor device 90 illustrated in FIG. 7. The circuit 110 includes a bidirectional switch 111 including a first input/output node 112, a second input/output node 113, a first diode 114 and a second diode 115. The first diode 114 and the second diode 115 are coupled anti-serially between the first input/output node 12 and the second input/output node 113.

When the first input/output node 112 acts as an input, the second input/output node 113 acts as the output of the bidirectional switch 111. When the second input/output node 113 acts as the input to the bidirectional switch 111, the first input/output node 112 acts as the output of the bidirectional switch 111. The circuit 110 is bidirectional and can be used to block voltage in opposing directions.

Each of the diodes 114, 115 includes a cathode and an anode. The anode 116 of the first diode 114 and the anode 117 of the second diode 115 are coupled to a field plate structure 122 which is coupled to near source potential.

The cathode 119 of the first diode 114 is electrically coupled to the first input/output node 112. The cathode 120 of the second diode 115 is electrically coupled to the second input/output node 113.

The bidirectional switch 111 may be provided by a single transistor device 121. The single transistor device 121 may be a Group III nitride-based High Electron Mobility Transistor (HEMT).

FIG. 9 illustrates a schematic view of a semiconductor device 130 including a transistor device 131 configured as a bidirectional switch, a first diode 132 and a second diode 133. In this embodiment, the transistor device 131 is a Group III nitride-based High Electron Mobility Transistor (HEMT) and the diodes 132, 133 are integrated into the transistor device 131 and formed in the semiconductor body providing the HEMT.

The HEMT 131 includes a transistor structure configured as a bidirectional switch including a first input/output contact 134, a single gate 135 and a second input/output contact 136. The first input/output contact 134, the single gate 135 and the second input/output contact 136 are arranged on a barrier layer 137 including aluminium gallium nitride $Al_xGa_{(1-x)}N$, where $0<x<1$, which is arranged on a channel layer 138 including gallium nitride GaN which is, in turn, arranged on a substrate 139. The gate 135 is arranged between the first input/output contact 134 and the second input/output contact 136 such that it is substantially equidistant from the first input/output contact pad 134 and the second input/output contact pad 136. This arrangement may be used to achieve a substantially symmetrical voltage blocking capability in both directions.

The first diode 132 may be provided by one or more of the transistor cells of the HEMT 131. The first diode 132 includes a transistor structure including a first current electrode 140, a gate 141 and a second current electrode 142 which are arranged on the barrier layer 137. The second current electrode 142 is electrically coupled to the gate 141 by a conductive structure and forms the anode 143 of the diode 132. The first current electrode 140 forms the cathode of the diode 132 and is electrically coupled to the first input/output contact 134 of the transistor device 131 as is schematically illustrated in FIG. 9 by the line 145. The anode 143 is electrically coupled to a field plate 146 of the HEMT 131 as is schematically illustrated in FIG. 9 by the line 147.

The field plate 146 is arranged above and is electrically insulated from the gate 135. The field plate 146 has a lateral extent which is larger in directions towards the first input/output contact 134 and towards the second input/output contact 135 than the lateral extent of the gate 135.

The second diode 133 is also formed from one or more of the transistor cells and also has a transistor structure including a first current electrode 148, a gate 149 and a second current electrode 150 arranged on the barrier layer 137. The first current electrode 148 is electrically coupled to the gate 149 of the first diode 132 and forms the anode 151. The anode 151 is electrically coupled to the anode 143 of the first diode 132 and to the field plate 146 of the HEMT 131, as is schematically indicated by the line 152. The second current electrode 150 forms the cathode of the diode 133 and is electrically coupled to the second input/output contact pad 136 of the HEMT 131, as is schematically indicated by the line 153.

In this embodiment, the HEMT 131 is a depletion mode device, which is normally on. However, the transistor cells forming the diodes 132, 133 have an enhancement mode transistor structure. The enhancement mode transistor structure may be provided by providing a gate recess 154, i.e. by reducing the thickness of the barrier layer 137 in the region under the gates 141, 149, in the transistor cells forming the diodes 132, 133.

FIG. 10 illustrates a schematic view of a semiconductor device 160 including a Group III nitride-based HEMT 131', a first diode 132' and a second diode 133' which each include a transistor structure and which are integrated into the HEMT 131' as in the embodiment illustrated in FIG. 9. Like features are indicated with like reference numbers denoted with a prime "'".

The semiconductor device 160 differs from the semiconductor device 130 illustrated in FIG. 9 in that the HEMT 131' is an enhancement mode device which is normally off. The arrangement of the HEMT 131 may be modified in various ways to transform the depletion mode device 131 into an enhancement mode device 131'. In the embodiment illustrated in FIG. 10, a p-doped Group III nitride layer 161, such as a p-doped GaN or p-doped AlGaN layer, is provided which is situated between the gate 135' and the barrier layer 137'. In other embodiments, a recessed gate may be used to produce an enhancement mode device. The diodes 132', 133' also include a p-doped GaN region 162, 163, respectively, arranged between the barrier layer 137' and the gate metal 141' which forms part of the anode 143' of the first diode 132' and the gate metal 149' which forms part of the anode 151' of the second diode 133'. The diodes 132', 133' are electrically coupled anti-serially between the first input/output contact pad 134' and the second input/output contact pad 136' and such that the anodes 143', 151' are electrically coupled to the field plate 146'.

The transistor cells providing the HEMT 131' and bidirectional switch and the diodes 132', 133' may have the same transistor structure. For example, the transistor cells providing the HEMT 131' and bidirectional switch and the transistor cell or cells providing the diodes 132', 133' may have a recessed gate structure or include a p-doped Group III nitride layer under the gate.

As discussed above, the Group III nitride-based High Electron Mobility Transistor, which is configured as a bidirectional switch, may include an enhancement mode device. The enhancement mode device may include at least one p-doped Group III nitride layer, such as a p-doped GaN layer and/or a p-doped aluminium gallium nitride layer, arranged between the metal gate and the barrier layer.

FIG. 11 illustrates a schematic view of an enhancement mode Group III nitride-based High Electron Mobility Transistor (HEMT) 170 configured as a bidirectional switch 171 which includes a p-doped Group III nitride-based layer 172 arranged between a T-shaped metal gate 173 and a barrier layer 174. The barrier layer 174 includes aluminium gallium nitride and is arranged on a channel layer 175 including gallium nitride which is in turn arranged on a substrate 176. A two-dimensional electron gas (2DEG) is formed at the interface between the channel layer 175 and the barrier layer 174 by induced and spontaneous polarization, as is indicated schematically by dashed line 179. The p-doped Group III nitride-based layer 172 includes two sublayers 177, 178. The first sublayer 177 is arranged on the barrier layer 174 and includes p-doped aluminium gallium nitride. The second sublayer 179 is arranged on the first sublayer 178 and includes p-doped gallium nitride. The vertical portion of the T-shaped gate 173 is arranged on the p-doped gallium nitride layer 178. The lateral extent of both the sublayers 178, 179 may be substantially the same as the lateral extent of the base of the gate 173.

This structure of the p-doped Group III nitride layer 172 may be used for Group III nitride-based High Electron Mobility Transistors including a single gate, such as that illustrated in FIG. 11, as well as HEMTs which include two independently controllable gates. The HEMT 170 may include a field plate structure 180 according to one of the embodiments described herein. The HEMT 170 may also include two diodes coupled antiserially between the first input/output electrode 181 and the second input/output electrode 182 and coupled to the field plate structure 180 according to one of the embodiments described herein.

FIG. 12 illustrates a schematic view of a Group III nitride-based device 181 including a bidirectional switch. The Group III nitride-based HEMT 181 includes a channel layer 191 and a barrier layer 182 arranged on the channel layer. The channel layer 191 is arranged on a substrate 200. The channel layer 191 may include gallium nitride and the barrier layer 192 may include aluminium gallium nitride such that a two-dimensional electron gas (2DEG) 193 is formed at the interface between the aluminium gallium nitride layer and the gallium nitride layer. The composition of the barrier layer 192 may vary within the barrier layer 192.

The composition of the barrier layer 192 may vary in directions substantially perpendicular to the two-dimensional electron gas 193. In particular, the aluminium content and, consequently, the gallium content may vary through the thickness of the barrier layer 192, for example, from the interface 194 between the barrier layer 192 and the channel layer 191 to the outermost surface of the barrier layer 192. The composition may vary gradually providing a graded composition structure.

In some embodiments, the barrier layer 192 includes two or more sublayers 196, 197 of differing composition, in particular, aluminium gallium nitride of differing composition. The first sublayer 196 which is arranged on the channel layer 191 may include an aluminium content which is lower than the aluminium content of the second sublayer 197 which is arranged on the first sublayer 186.

A barrier layer 182 with spatially varying composition may be used with one or more of the features of the embodiments of HEMTs described herein. For example, the barrier 192 with spatially varying composition may be used for HEMTs configured as bidirectional switches including a single gate 198 or two independently controllable gates, with a field plate structure 199 which is coupled to source potential or a floating potential and with embodiments including two diodes coupled antiserially between the first input/output electrode 201 and second input/output electrode 202 and a field plate structure 199 arranged above the gate or gates.

The arrangement of the first input/output electrode and the second input/output electrode is not limited to a position on an outermost planar surface of the barrier layer. In some embodiments, the first input/output electrode and the second input/output electrode may extend into the barrier layer and may extend to the interface between the barrier layer and the underlying channel layer or may extend into the channel layer.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a Group III-nitride-based High Electron Mobility Transistor (HEMT) configured as a bidirectional switch and comprising a first input/output electrode, a second input/output electrode, a gate structure laterally arranged between the first input/output electrode and the second input/output electrode, and a field plate structure,
   wherein the gate structure comprises a horizontal portion that is disposed above a channel of the High Electron Mobility Transistor, and
   wherein the field plate structure comprises a horizontal portion that is disposed directly above the horizontal portion of the gate structure and is completely planar across an entire width of the field plate structure.

2. The semiconductor device of claim 1, wherein the field plate structure comprises a vertical portion extending from the horizontal portion, the vertical portion being arranged on and coupled to the gate structure and the horizontal portion of the field plate structure extending substantially symmetrically between the first input/output electrode and the second input/output electrode.

3. The semiconductor device of claim 1, wherein the gate structure comprises a T-shaped gate metal.

4. The semiconductor device of claim 1, wherein the gate structure comprises two independently controllable gates.

5. The semiconductor device of claim 4, wherein the field plate structure comprises a vertical portion arranged between the two independently controllable gates and the horizontal portion of the field plate structure.

6. The semiconductor device of claim 4, wherein the field plate structure comprises a first portion coupled to the first input/output electrode and a second portion coupled to the second input/output electrode.

7. The semiconductor device of claim 1, wherein the Group III-nitride-based HEMT comprises a channel layer comprising GaN and a barrier layer arranged on the channel layer, the barrier layer comprising $Al_xGa_{(1-x)}N$, wherein $0<x<1$.

8. The semiconductor device of claim 1, further comprising at least one p-doped Group III nitride layer under the gate structure.

9. The semiconductor device of claim 1, wherein the field plate structure is arranged asymmetrically with respect to the first input/output electrode and the second input/output electrode.

10. A semiconductor device, comprising:
a Group III-nitride-based High Electron Mobility Transistor (HEMT) configured as a bidirectional switch and comprising a first input/output electrode, a second input/output electrode, a gate structure arranged between the first input/output electrode and the second input/output electrode, a field plate structure, a first diode and a second diode, wherein the first diode and the second diode are coupled anti-serially between the first input/output electrode and the second input/output electrode,
wherein the gate structure comprises a single gate, wherein an anode of the first diode and an anode of the second diode are coupled to a field plate arranged directly over the single gate.

11. The semiconductor device of claim 10, wherein a cathode of the first diode is coupled to the first input/output electrode, and wherein a cathode of the second diode is coupled to the second input/output electrode.

12. The semiconductor device of claim 10, wherein the first diode and the second diode are discrete components.

13. The semiconductor device of claim 10, wherein the first diode and the second diode are integrated into the Group III-nitride-based HEMT.

14. The semiconductor device of claim 13, wherein at least one of the first diode and the second diode comprises an enhancement mode transistor structure comprising a first current electrode, a gate electrode and a second current electrode, wherein the first current electrode is coupled to the gate and to the field plate structure, and wherein the second current electrode is electrically coupled to the first input/output electrode of the Group III-nitride-based HEMT.

15. The semiconductor device of claim 10, wherein at least one of the first diode and the second diode is a pn diode.

16. The semiconductor device of claim 10, wherein the Group III nitride-based HEMT is a depletion mode device.

17. The semiconductor device of claim 10, wherein the Group III-nitride-based HEMT comprises a channel layer comprising GaN and a barrier layer arranged on the channel layer, the barrier layer comprising $Al_xGa_{(1-x)}N$, wherein $0<x<1$.

18. The semiconductor device of claim 17, further comprising at least one p-doped Group III-nitride layer arranged between the gate and the barrier layer.

19. The semiconductor device of claim 18, wherein the p-doped Group III-nitride layer comprises at least one a p-doped GaN layer and a p-doped $Al_zGa_{(1-z)}N$ layer, wherein $0<z<1$.

20. The semiconductor device of claim 17, wherein the barrier layer has a laterally thickness and a vertically content.

* * * * *